(12) United States Patent
Shen et al.

(10) Patent No.: US 9,967,997 B1
(45) Date of Patent: May 8, 2018

(54) SERVER EQUIPMENT HAVING FOOL-PROOF STRUCTURE

(71) Applicant: Super Micro Computer Inc., San Jose, CA (US)

(72) Inventors: William Shen, San Jose, CA (US); Te-Chang Lin, San Jose, CA (US); Richard S. Chen, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 0 days. days.

(21) Appl. No.: 15/640,450

(22) Filed: Jun. 30, 2017

(30) Foreign Application Priority Data

Apr. 12, 2017 (TW) .............................. 106205079 U (51) Int. Cl.
*H05K 7/14* (2006.01)
*H05K 7/20* (2006.01)

(52) U.S. Cl.
CPC ....... *H05K 7/1489* (2013.01); *H05K 7/20709* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,402,072 B1* | 7/2008 | Chen | .................... | H05K 7/1408 312/223.2 |
| 7,499,285 B2* | 3/2009 | Chen | .................... | G06F 13/409 361/752 |
| 7,639,507 B2* | 12/2009 | Chen | ....................... | G06F 1/185 361/727 |
| 7,839,624 B2* | 11/2010 | Lin | .......................... | G06F 1/184 361/679.02 |
| 7,894,195 B2* | 2/2011 | Lin | ....................... | H05K 7/1487 361/727 |
| 8,493,718 B2* | 7/2013 | Zhang | ..................... | G06F 1/181 361/679.01 |
| 9,609,778 B1* | 3/2017 | Spencer | ................... | G06F 1/183 |
| 9,668,383 B2* | 5/2017 | Cox | ........................... | G06F 1/20 |
| 9,686,882 B2* | 6/2017 | Bailey | ................... | H05K 7/1489 |
| 9,769,958 B2* | 9/2017 | Jaskela | ............... | H05K 7/20718 |
| 9,775,263 B2* | 9/2017 | Ross | ........................ | G06F 1/187 |
| 2008/0035588 A1* | 2/2008 | Liang | .................... | H05K 7/1421 211/26 |
| 2017/0332519 A1* | 11/2017 | Schmidtke | ......... | H05K 7/20736 |

* cited by examiner

*Primary Examiner* — Lisa Lea Edmonds
(74) *Attorney, Agent, or Firm* — Chun-Ming Shih; HDLS IPR Services (57) ABSTRACT

Server equipment having a fool-proof structure includes a casing and a tray. The casing includes a storage unit area, a plurality of motherboard areas, a back plate, insertion slots and a fool-proof device. The fool-proof device selectively has an engagement member at a first height or an engagement member at a second height. The tray includes a motherboard, a connection card and a protection housing. When the protection housing is in contact with the engagement member at the first height, the connection card is correspondingly inserted into the insertion slot. When the protection housing is in contact with the engagement member at the second height, the connection card is spaced from the insertion slot by a distance. Accordingly, the connection card is prevented from being inserted to a wrong insertion slot, so damage to the connection card is avoided.

10 Claims, 9 Drawing Sheets

SERVER EQUIPMENT HAVING FOOL-PROOF STRUCTURE

TECHNICAL FIELD

The present invention relates to server equipment and, in particular, relates to server equipment having a fool-proof structure capable of preventing a connection card from being inserted into an insertion slot by mistake, so as to avoid damage to the connection card.

BACKGROUND

Solid state disks (SSD) have faster read/write speed than conventional hard disk drives (HDD). Compared with the conventional HDD, the SSD has many advantages such as having no mechanical read/write heads, being more endurable against external impacts/collisions, having less noise and generating less heat. With rapid development of the semiconductor technology, the SSD offers a high storage density at lower costs. Consequently, server industry has a tendency to use SSD instead of HDD for massive data storage.

In order to boost the performance of the SSD, which includes improving TOPS (i.e. input/output operations per second) speed and work performance among processors, platforms and applications, a non-volatile memory express (NVMe) protocol is developed. An NVMe card is developed based on flash memory, and the NVMe card works with the SSD better than an advanced host controller interface (AHCI). Therefore, the NVMe card greatly reduces latency between a controller and a software interface, and optimizes the performance of the solid state disks using SATA (i.e. serial advanced technology attachment).

In the server industry, the NVMe cards are costly and typically have two different card sizes, so an insertion slot in a server chassis also has two different sizes. When the NVMe card is inserted to a wrong insertion slot, the NVMe card is often damaged by the wrong insertion, leading to unnecessary high maintenance costs. In views of this, in order to solve the above disadvantages, the present inventor studied related technology and provided a reasonable and effective solution in the present disclosure.

SUMMARY

It is an object of the present invention to provide server equipment having a fool-proof structure, whereby a connection card is prevented from being inserted into an insertion slot by mistake, thus protecting the connection card from being damaged.

Accordingly, the present invention provides server equipment having a fool-proof structure, comprising a casing and at least one tray. The casing includes a storage unit area, a plurality of motherboard areas, a back plate separating the storage unit area from the motherboard areas, at least one insertion slot connected to the back plate, and a fool-proof device disposed adjacent to the insertion slot, wherein an engagement member at a first height or an engagement member at a second height is selectively disposed in the fool-proof device. The tray includes a motherboard, a connection card connected to the motherboard and disposed corresponding to the insertion slot, and a protection housing disposed corresponding to the connection card, wherein the tray is slidable in any corresponding motherboard area; when the protection housing is in contact with the engagement member at the first height, the connection card is correspondingly inserted into the insertion slot; and when the protection housing is in contact with the engagement member at the second height, the connection card is spaced from the insertion slot by a distance.

When the protection housing correspondingly contacts the engagement member at the first height, the connection card is correspondingly inserted into the insertion slot. On the contrary, when the protection housing correspondingly contacts the engagement member at the second height, the connection card is spaced apart from the insertion slot by a distance. That is to say, when the protection housing contacts the engagement member unmatched in height, the connection card is not able to be inserted into the insertion slot, so the connection card is effectively protected without being damaged or collided by wrong insertion. In addition, if the protection housing and the fool-proof device are damaged by wrong insertion, only the protection housing and/or the fool-proof device need to be replaced, so maintenance costs are greatly reduced.

The fool-proof device includes a fool-proof plate vertically connected to the back plate, and the engagement member is inserted through and fixed to the fool-proof plate. In one embodiment, the engagement member at the first height is a pin, the protection housing includes an engagement groove arranged corresponding to the pin for engagement with the pin. In another embodiment, the engagement member at the second height is a pin; an edge of the protection housing includes a recess corresponding to the pin for contact with the pin, thus achieving a fool-proof effect.

The engagement groove includes a first section and a second section connected to the first section, the second section has a smaller size than a size of the first section, and the second section restricts movement of the pin in a perpendicular direction with respect to an insertion direction of the pin. The pin has a head portion, an end portion, and a neck portion connected to the head portion and the end portion, sizes of the head portion and the end portion are larger than a size of the neck portion, and the neck portion passes through the first section and the second section to be engaged with the second section.

When the engagement groove is engaged with the pin at the first height, the pin easily enters the first section by the neck portion, and then the pin enters the second section and engages the same with the neck portion having a size similar to the second section. Since the engagement groove of the protection housing is engaged with the pin, the connection card can be inserted into the insertion slot with stability and reliability.

BRIEF DESCRIPTION OF THE DRAWINGS

The disclosure will become more fully understood from the detailed description, and the drawings given herein below is for illustration only, and thus does not limit the disclosure, wherein.

DETAILED DESCRIPTION

Detailed descriptions and technical contents of the present invention are illustrated below in conjunction with the accompany drawings. However, it is to be understood that the descriptions and the accompany drawings disclosed herein are merely illustrative and exemplary and not intended to limit the scope of the present invention.

Figure 1:
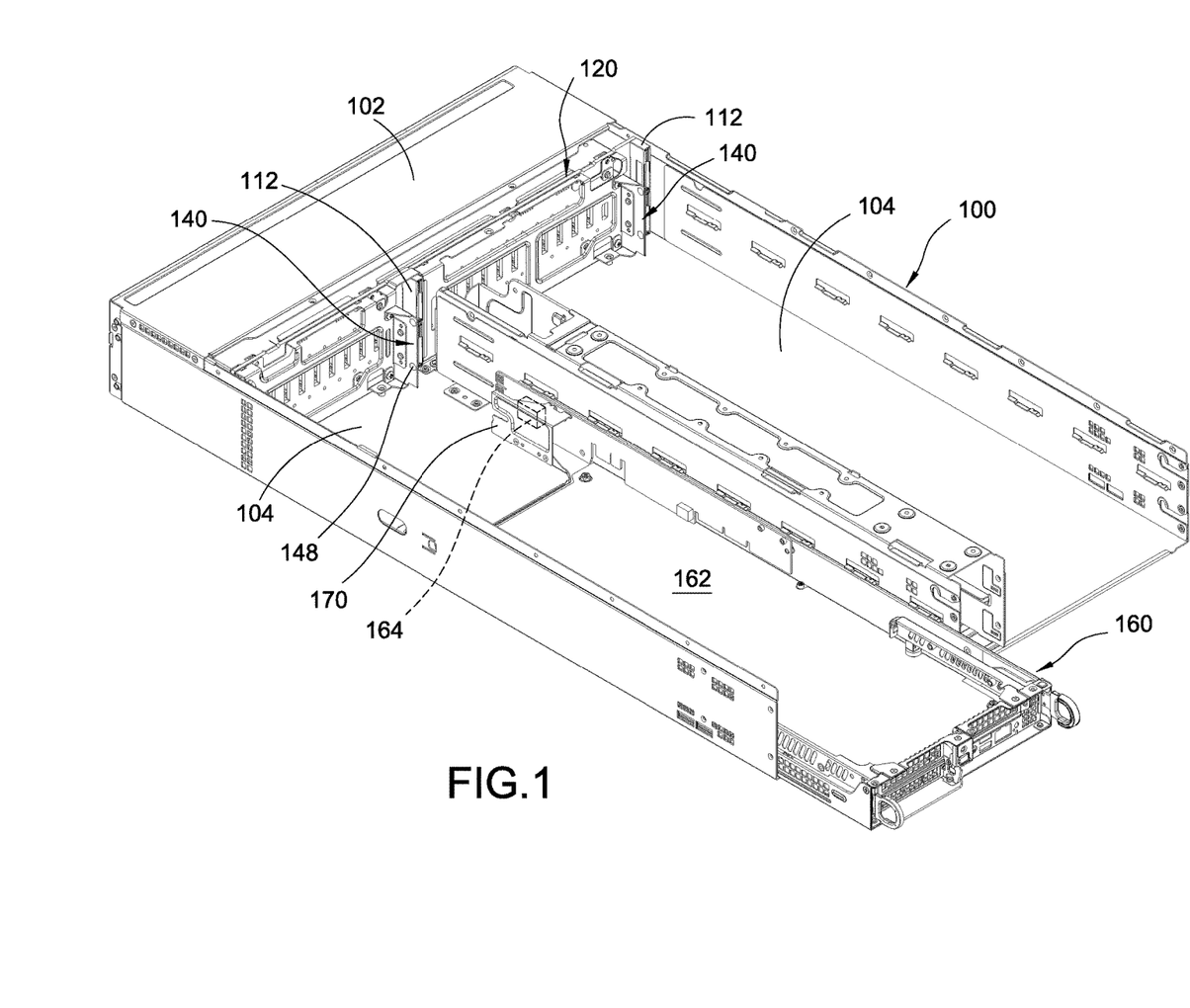
FIG. 1 is a perspective view showing server equipment having a fool-proof structure according to the present invention.
Figure 2:
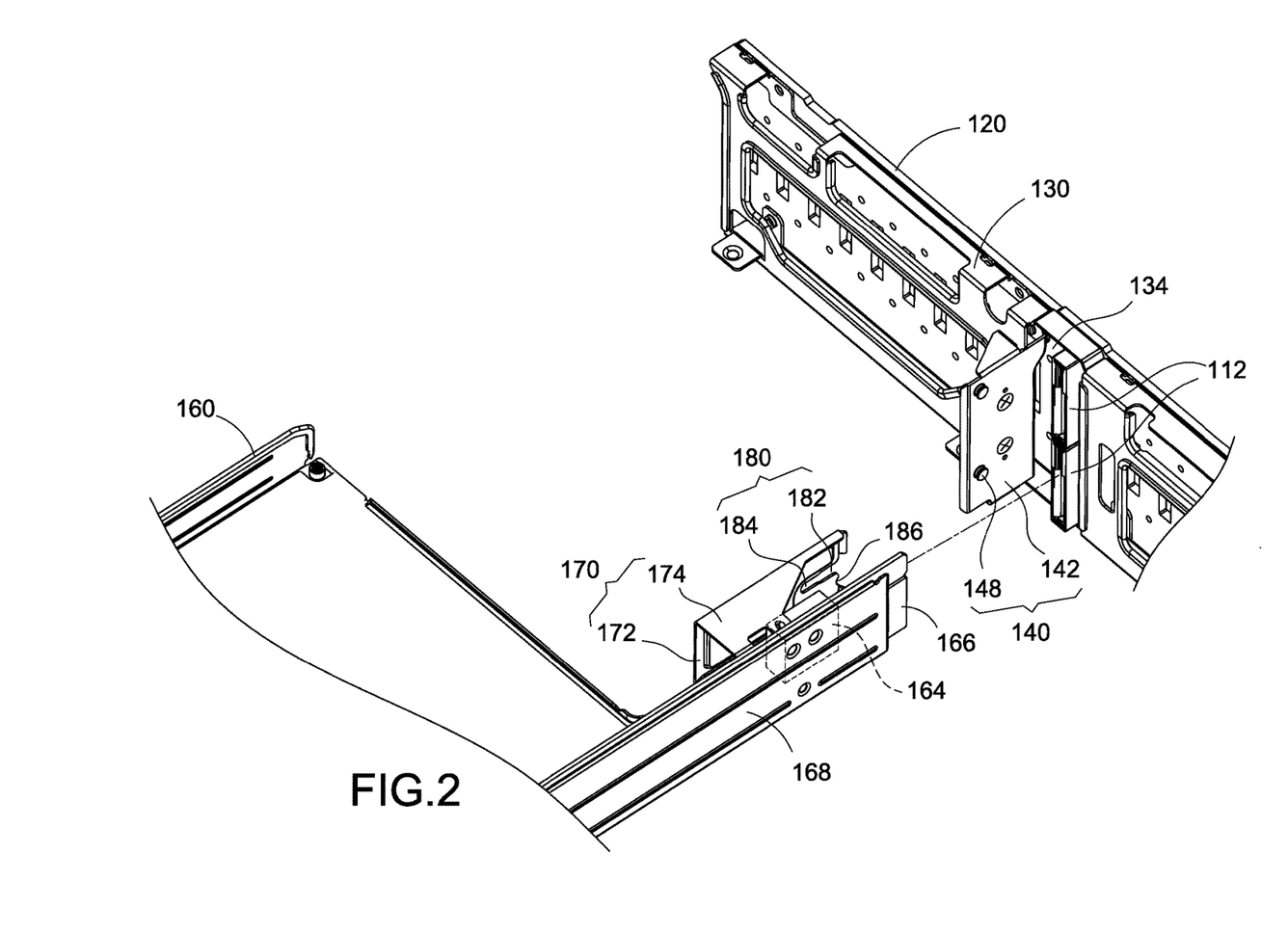
FIG. 2 is a partial exploded view showing the server equipment having the fool-proof structure according to the present invention.
Figure 8A:
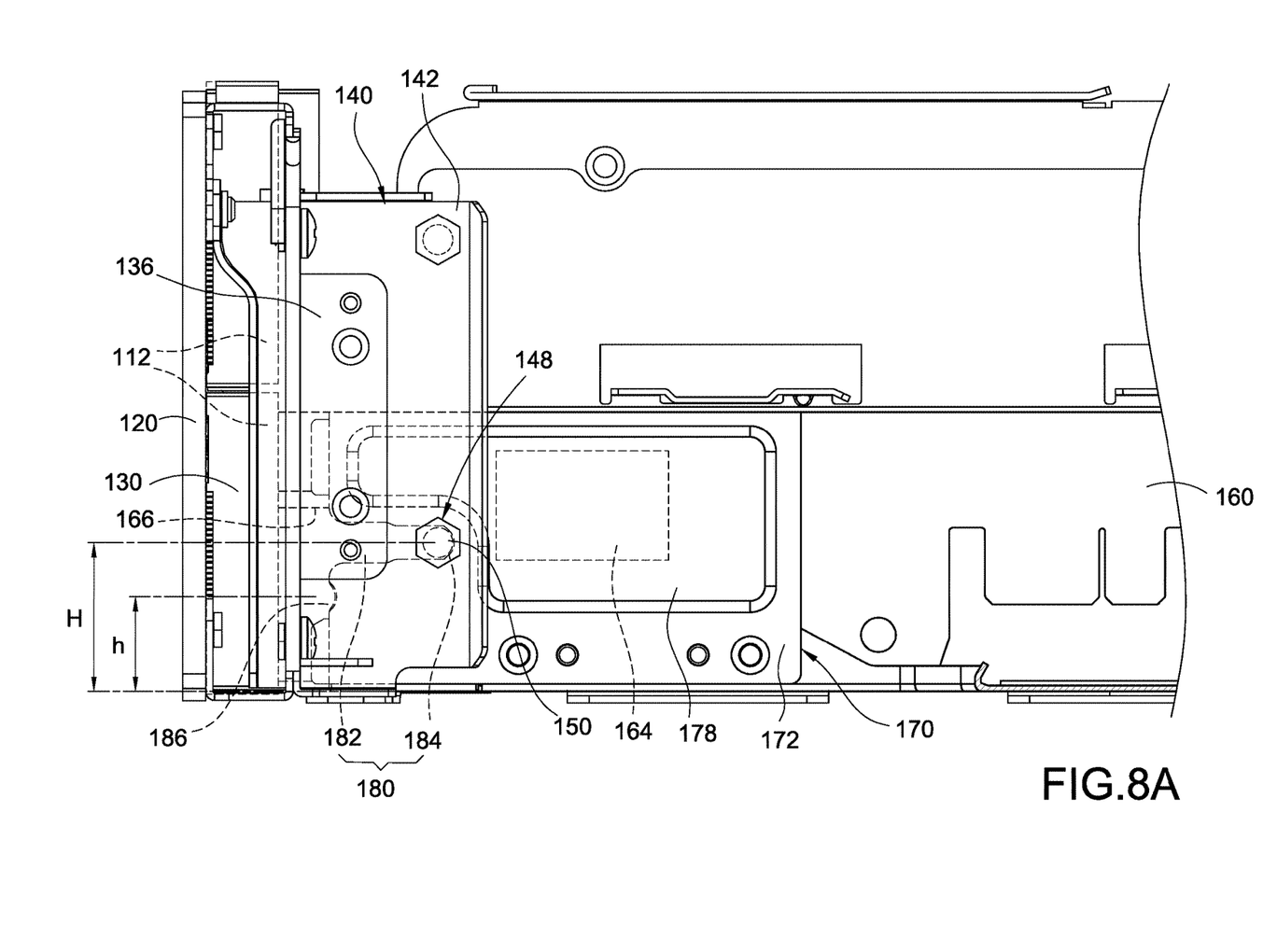
FIG. 8A is a lateral view showing the engagement member at the first height being engaged with the protection housing.
Figure 8B:
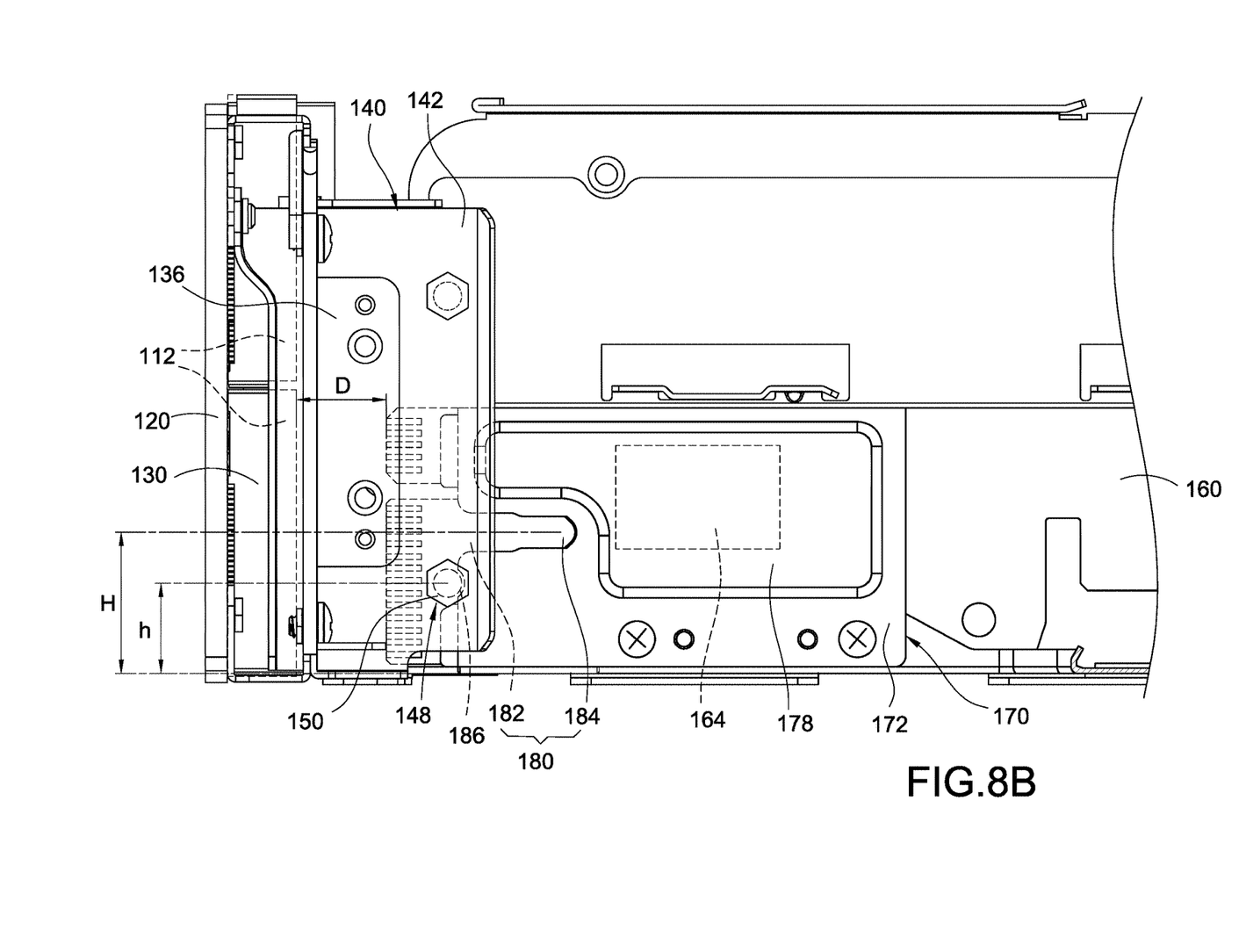
FIG. 8B is a lateral view showing an engagement member at a second height being engaged with the protection housing.

Referring to FIGS. 1, 8A and 8B, the present invention provides server equipment having a fool-proof structure. The server equipment includes a casing 100 and at least one tray 160. The casing 100 includes a storage unit area 102, two motherboard areas 104 juxtaposed with each other, a back plate 120 separating the storage unit area 102 from the motherboard areas 104, at least one insertion slot 112 connected to the back plate 120, and a fool-proof device 140 disposed adjacent to the insertion slot 112, wherein an engagement member 148 at a first height H or an engagement member 148 at a second height h is selectively disposed in the fool-proof device 140.

As shown in FIG. 1, a plurality of solid state disks (SSD) or other suitable storage media (not illustrated) are received in the storage unit area 102. It is preferable that there are two trays 160 stacked one above the other in each motherboard area 104. Each tray 160 is movable in the corresponding motherboard area 104 to be inserted and connected with the insertion slot 112. In FIG. 1, the number of the motherboard areas 104 and the number of the trays 160 and their positions may vary depending on a size of the casing 100 and different demands.

The tray 160 includes a motherboard 162, a connection card 164 connected to the motherboard 162 and arranged corresponding to the insertion slot 112, and a protection housing 170 arranged corresponding to the connection card 164. The tray 160 is slidable in any corresponding motherboard area 104. When the protection housing 170 is in contact with the engagement member 148 at the first height H, the connection card 164 is correspondingly inserted into the insertion slot 112. When the protection housing 170 is in contact with the engagement member 148 at the second height h, the connection card 164 is spaced from the insertion slot 112 by a distance D.

Figure 3:
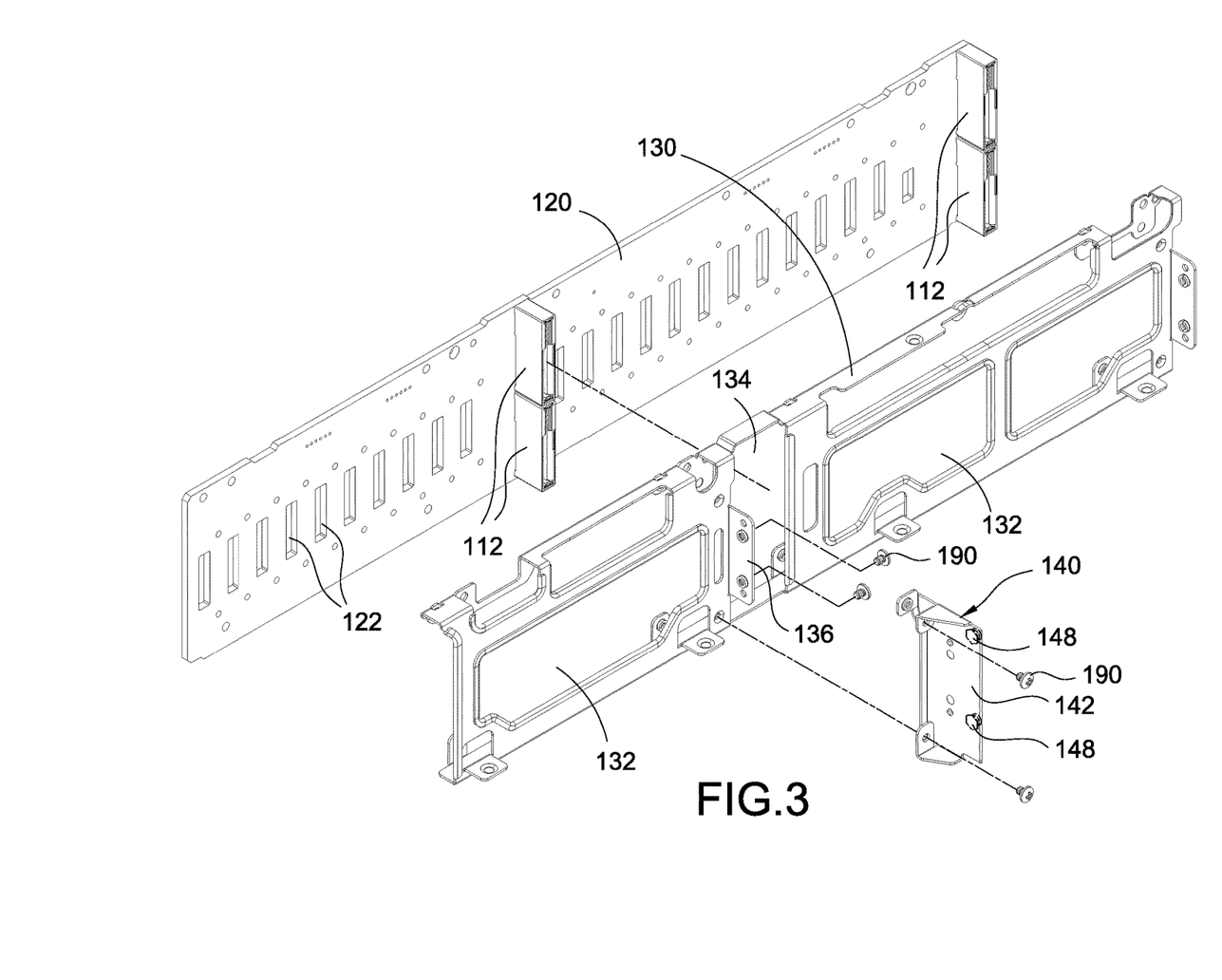
FIG. 3 is an exploded view showing a back plate and a frame of the server equipment having the fool-proof structure.
Figure 4:
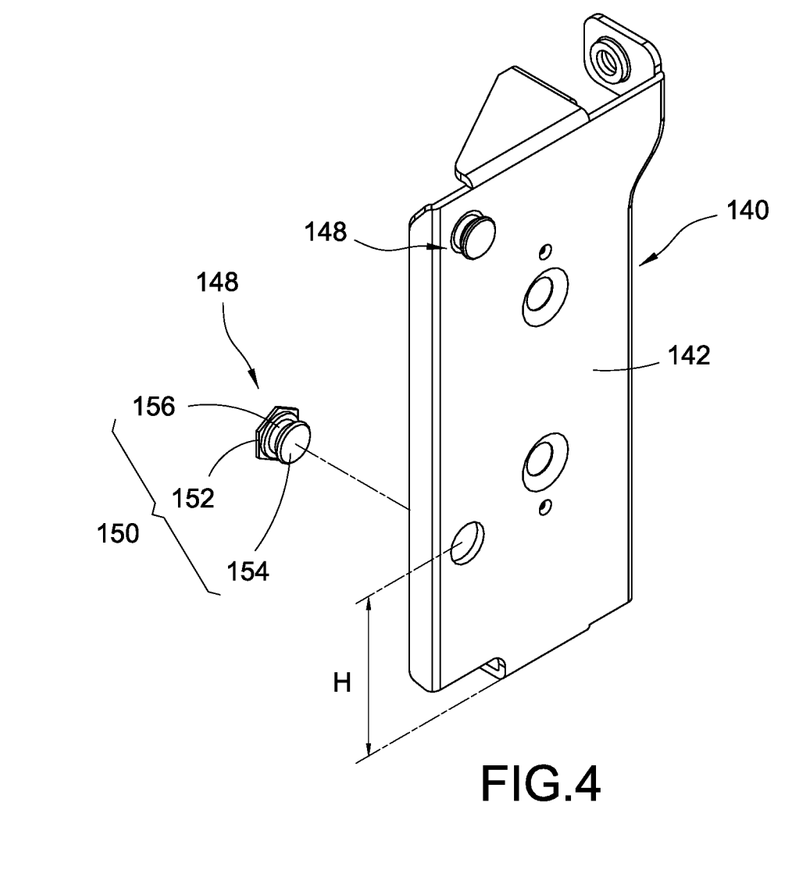
FIG. 4 is a perspective view showing a fool-proof device according to the present invention.
Figure 5:
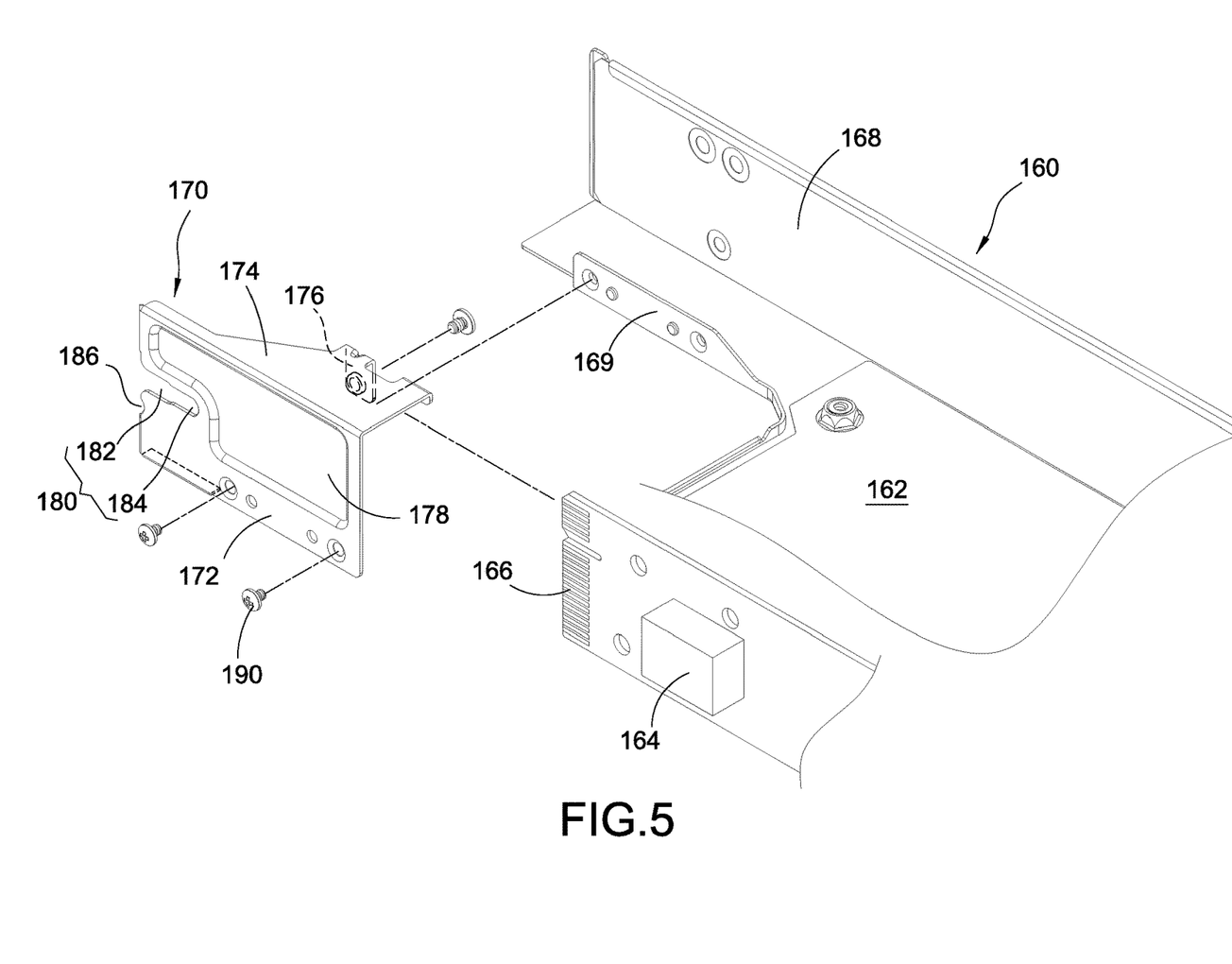
FIG. 5 is an exploded view showing a connection card, a protection housing and a tray.

Referring to FIGS. 3, 4 and 5, the fool-proof device 140 which is preferably made of metal includes a fool-proof plate 142 (i.e. a support plate) vertically connected to the back plate 120, the engagement member 148 is inserted through and fixed to the fool-proof plate 142. In the embodiment shown in FIGS. 1 to 8A, the engagement member 148 at the first height H is a pin 150, the protection housing 170 includes an engagement groove 180 arranged corresponding to the pin 150 for engagement with the pin 150. In the embodiment shown in FIG. 8B, the engagement member 148 at the second height h is a pin 150, an edge of the protection housing 170 includes a recess 186 arranged corresponding to the pin 150 for contact with the pin 150, thereby avoiding wrong insertion of the connection card 164 into the insertion slot 112, thus achieving a fool-proof function which protects the connection card 164 from damage. In the present embodiment, the connection card 164 preferably includes, but not limited to, a non-volatile memory express (NVMe) card.

As shown in FIG. 4, each pin 150 looks like a bolt and has a head portion 152, an end portion 154 and a neck portion 156 connected to the head portion 152 and the end portion 154, and sizes of the head portion 152 and the end portion 154 are larger than a size of the neck portion 156. As shown in FIG. 5, the engagement groove 180 includes a first section 182 and a second section 184 connected to the first section 182, the first section 182 has a larger size than a size of the second section 184, and the second section 184 restricts movement of the pin 150 in a perpendicular direction with respect to an insertion direction of the pin 150. In other words, the neck portion 156 of the pin 150 passes through the first section 182 and the second section 184 to be engaged with the second section 184.

Figure 6:
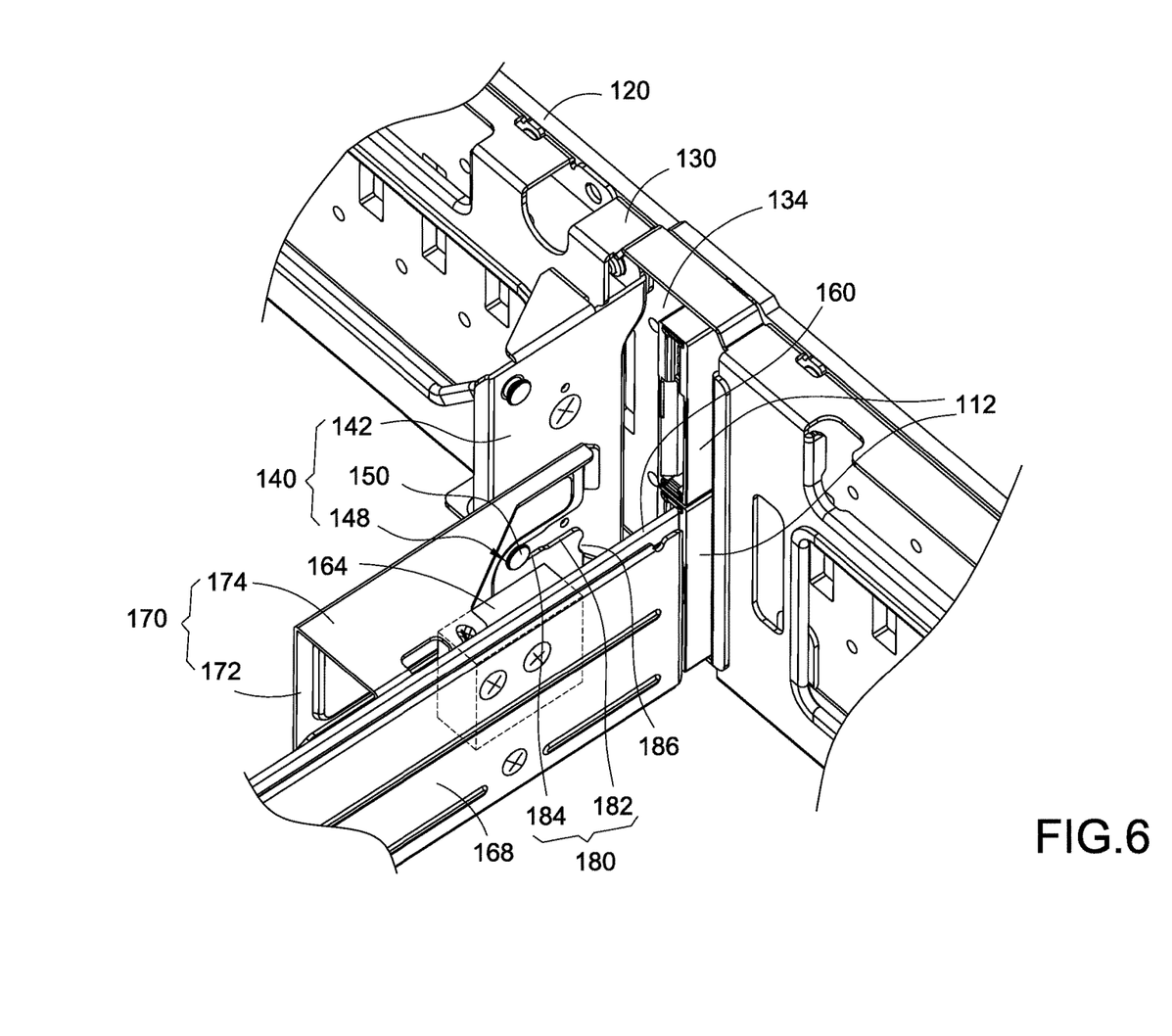
FIG. 6 is a perspective view showing the protection housing being engaged with an engagement member at a first height.
Figure 7:
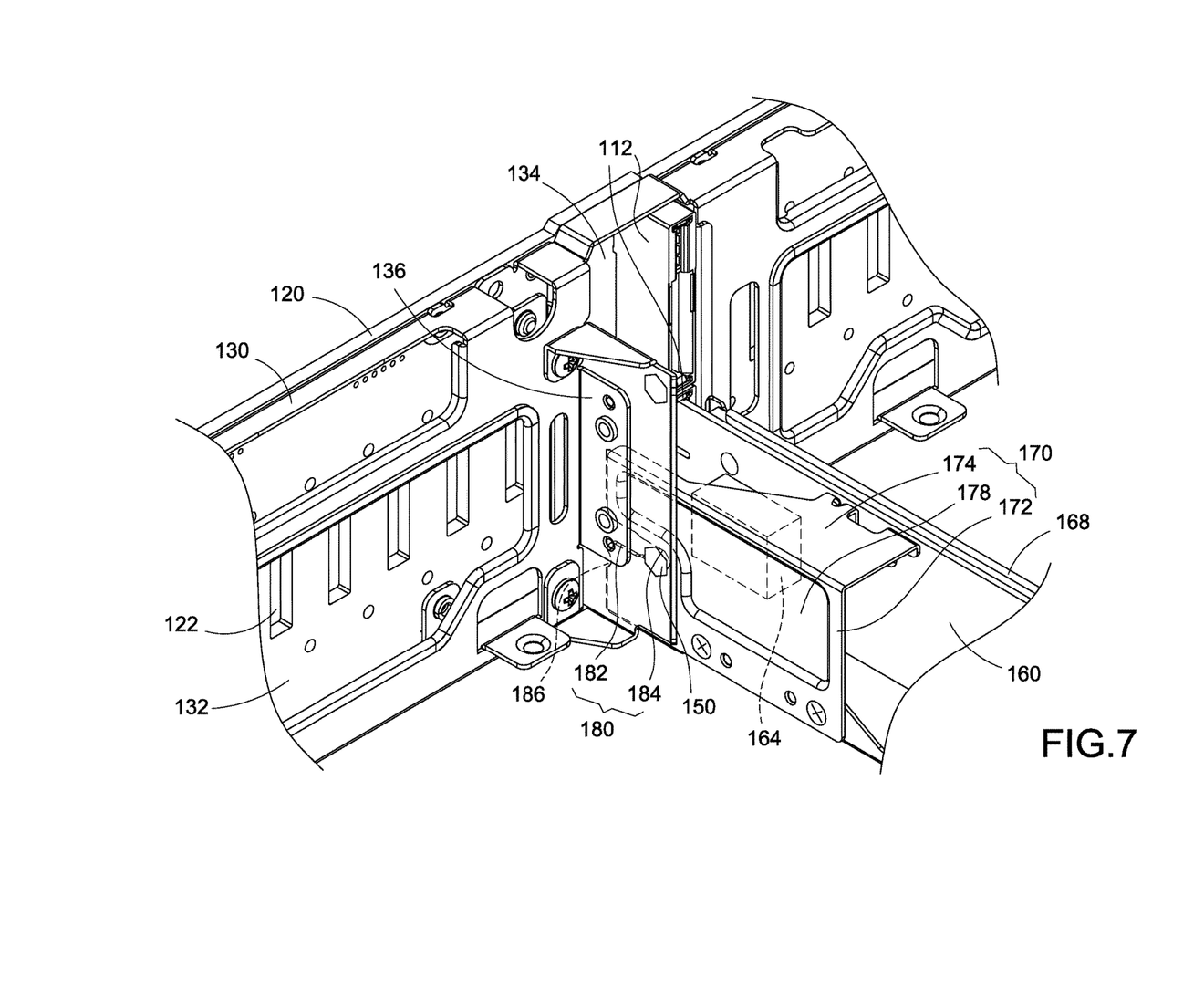
FIG. 7 is another perspective view of FIG. 6, taken from a different viewing angle.

As shown in FIGS. 6 and 7, when the engagement groove 180 is to be correspondingly engaged with the pin 150 of the fool-proof device 140 at the first height H, the neck portion 156 of the pin 150 easily enters the first section 182 larger in size, and then the neck portion 156 enters the smaller second section 184 for engagement with the same. Since the second section 184 and the neck portion 156 are similar in size, so the engagement groove 180 of the protection housing 170 can be securely engaged with the pin 150, thereby further restricting movement of the pin 150 in the perpendicular direction with respect to the insertion direction of the pin 150. Furthermore, due to engagement of the engagement groove 180 of the protection housing 170 with the pin 150, the connection card 164 is electrically connected to the insertion slot 112 with stability and reliability, and is prevented from being short-circuited by shaking and vibrations of the server equipment.

Referring to FIG. 5, the protection housing 170 is made of metal and includes a flat plate 172, a lateral plate 174 connected to the flat plate 172, a bent plate 176 bent from the lateral plate 174, and a rib portion 178 disposed in the flat plate 172. The rib portion 178 is used to reinforce the structural strength of the protection housing 170; the recess 186 is formed on an edge of the flat plate 172 to contact the pin 150 at the second height h. More details will be described hereinafter.

Moreover, an extending plate 168 where the connection card 164 is installed extends from one end of the tray 160, and the flat plate 172 and the bent plate 176 are in contact with the extending plate 168. The protection housing 170 is fastened to the extending plate 168 by fastening elements 190 like screws. In the embodiment shown in FIG. 5, a folded plate 198 is bent from one side of the extending plate 168, and the folded plate 169 is configured to be in contact with the flat plate 172 of the protection housing 170, so that the fastening element 190 can fix the flat plate 172 to the folded plate 169.

As shown in FIG. 5, one end of the connection card 164 preferably includes an electrical connection end 166 which extends therefrom and is in contact with an inner surface of the extending plate 168. The electrical connection end 166 protrudes out of the protection housing 170 to be inserted into the insertion slot 112.

The present embodiment further comprises a frame 130 assembled to the back plate 120. The back plate 120 shown in FIG. 3 is preferably a circuit board. The at least one insertion slot 112 is arranged vertically and is electrically connected to the circuit board. The frame 130 has a through hole 134 corresponding to the at least one insertion slot 112, the electrical connection end 166 of the connection card 164 passes through the through hole 134 to be connected to the insertion slot 112. In the present embodiment, the connection card 164 preferably includes four insertion slots 112, and each insertion slot 112 is arranged corresponding to a corresponding one of the trays 160 in the motherboard areas 104 and is electrically connected to the connection card 164 of each tray 160. There is preferably a positioning plate 136 bent perpendicularly from the frame 130 made of metal and disposed adjacent to the through hole 134. The positioning plate 136 is fastened to the fool-proof device 140 by the fastening element 190 like a screw, thereby enhancing the structural strength of the fool-proof device 140.

Furthermore, the back plate 120 includes a plurality of first heat dissipation holes 122, the frame 130 includes a plurality of second heat dissipation holes 132 corresponding to the first heat dissipation holes 122, so that air flow between the storage unit area 102 and the respective motherboard areas 104 can pass through the first heat dissipation holes 122 and the second heat dissipation holes 132, and then heat can be expelled out by a fan unit (not illustrated). Since the back plate 120 and the frame 130 are of different materials, in FIG. 3 the number of the second heat dissipation holes 132 is less than the number of the first heat dissipation holes 122, and a size of the second heat dissipation hole 132 is larger than a size of the first heat dissipation hole 122.

As shown in FIG. 8A, when the engagement groove 180 of the protection housing 170 is engaged with the engagement member 148 at the first height H, the electrical connection end 166 of the connection card 164 is correspondingly inserted into the insertion slot 112 of the back plate 120. In other words, the engagement groove 180 corresponds in height to the first height H of the engagement member 148. When a size of the connection card 164 complies with specifications of the insertion slot 112, the electrical connection end 166 of the connection card 164 can be inserted into the insertion slot 112 of the same specifications.

The connection card 164 can be, for example, the NVMe card which has at least two different sizes. If a user inadvertently inserts the NVMe card into an unmatched insertion slot 112, the connection card 164 is damaged. Please refer to FIG. 8B, when the user wants to insert the connection card 164 to the unmatched insertion slot 112 (i.e. having different specifications), the recess 186 of the protection housing 170 is brought into contact with the engagement member 148 at the second height h, so that the electrical connection end 166 of the connection card 164 is spaced apart from the insertion slot 112 by a distance D. In other words, the recess 186 of the protection housing 170 is disposed corresponding to the second height h, thereby preventing the electrical connection end 166 of the connection card 164 from being damaged by inserting the electrical connection end 166 into the insertion slot 112 of different specifications. Even if the protection housing 170 and the fool-proof device 140 are damaged by wrong insertion, only the protection housing 170 and/or the fool-proof device 140 need to be replaced, so considerable maintenance costs are reduced.

Although in the present embodiment the second height h is lower than the first height H to keep a distance D (a fool-proof effect) from the insertion slot 112, it should be noted that in different embodiments, the first height H can also be higher than the second height h to achieve the fool proof effect, i.e. keeping the distance D from the insertion slot 112; configurations may vary as required, and the present is not limited in this regard.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. Server equipment having a fool-proof structure, comprising:
   a casing including a storage unit area, a plurality of motherboard areas, a back plate separating the storage unit area from the motherboard areas, at least one insertion slot connected to the back plate, and a fool-proof device disposed adjacent to the insertion slot, wherein an engagement member at a first height or an engagement member at a second height is selectively disposed in the fool-proof device; and
   at least one tray including a motherboard, a connection card connected to the motherboard and disposed corresponding to the insertion slot, and a protection housing disposed corresponding to the connection card, wherein the tray is slidable in any corresponding motherboard area; when the protection housing is in contact with the engagement member at the first height, the connection card is correspondingly inserted into the insertion slot; and when the protection housing is in contact with the engagement member at the second height, the connection card is spaced from the insertion slot by a distance.

2. The server equipment having the fool-proof structure according to claim 1, wherein the fool-proof device includes a fool-proof plate vertically connected to the back plate, and the engagement member is inserted through and fixed to the fool-proof plate.

3. The server equipment having the fool-proof structure according to claim 1, wherein the engagement member at the first height is a pin, the protection housing includes an engagement groove arranged corresponding to the pin for engagement with the pin, the engagement groove includes a first section and a second section connected to the first section, the second section has a smaller size than a size of the first section, and the second section restricts movement of the pin in a perpendicular direction with respect to an insertion direction of the pin.

4. The server equipment having the fool-proof structure according to claim 3, wherein the pin has a head portion, an end portion, and a neck portion connected to the head portion and the end portion, sizes of the head portion and the end portion are larger than a size of the neck portion, and the neck portion passes through the first section and the second section to be engaged with the second section.

5. The server equipment having the fool-proof structure according to claim 1, wherein the engagement member at the second height is a pin, an edge of the protection housing includes a recess corresponding to the pin for contact with the pin, the protection housing further includes a flat plate, a lateral plate connected to the flat plate, a bent plate bent from the lateral plate, and a rib portion disposed in the flat plate, and the recess is formed on an edge of the flat plate.

6. The server equipment having the fool-proof structure according to claim 5, wherein an extending plate where the connection card is installed extends from one end of the tray, and one side of the flat plate and the bent plate are in contact with the extending plate.

7. The server equipment having the fool-proof structure according to claim 6, wherein a folded plate is bent from one end of the extending plate, and the folded plate is in contact with the flat plate of the protection housing.

8. The server equipment having the fool-proof structure according to claim 1, further comprising a frame assembled to the back plate, the back plate being a circuit board, the at least one insertion slot being electrically connected to the circuit board, the frame having a through hole corresponding to the at least one insertion slot, the connection card passing through the through hole to be inserted into the insertion slot.

9. The server equipment having the fool-proof structure according to claim 8, wherein a positioning plate bent perpendicularly from the frame and is disposed adjacent to the through hole, and the fool-proof device is assembled to the positioning plate.

10. The server equipment having the fool-proof structure according to claim 8, wherein the circuit board includes a plurality of first heat dissipation holes, and the frame includes a plurality of second heat dissipation holes corresponding to the first heat dissipation holes, so that air flow between the storage unit area and the respective motherboard areas passes through the first heat dissipation holes and the second heat dissipation holes.

\* \* \* \* \*